United States Patent
Palmans et al.

(10) Patent No.: US 6,271,135 B1
(45) Date of Patent: Aug. 7, 2001

(54) METHOD FOR FORMING COPPER-CONTAINING METAL STUDS

(75) Inventors: Roger Palmans, Riemst; Joost Waeterloos, Leuven; Gibert Declerck, Winksele, all of (BE)

(73) Assignee: IMEC vzx, Leuven (BE)

( * ) Notice: Subject to any disclaimer, the term of this patent is extended or adjusted under 35 U.S.C. 154(b) by 0 days.

(21) Appl. No.: 09/348,553

(22) Filed: Jul. 7, 1999

(30) Foreign Application Priority Data

Jul. 7, 1998 (EP) .................................................. 98870150

(51) Int. Cl.⁷ .................................................... H01L 21/44
(52) U.S. Cl. ........................... 438/687; 438/584; 438/672
(58) Field of Search ..................... 438/687, 584, 438/672

(56) References Cited

U.S. PATENT DOCUMENTS

| | | |
|---|---|---|
| 4,866,008 | 9/1989 | Brighton et al. . |
| 4,873,565 | 10/1989 | Roane . |
| 5,149,615 | 9/1992 | Chakravorty et al. . |
| 5,674,787 | * 10/1997 | Zhao et al. . |
| 5,972,788 | * 10/1999 | Ryan et al. . |

FOREIGN PATENT DOCUMENTS 0 262 719   4/1988   (EP) .

OTHER PUBLICATIONS

Hu, C.K., et al., "Copper interconnection integration and reliability" Thin Solid Films, vol. 262, No. 1/2, Jun. 15, 1995, pp. 84–92.

* cited by examiner

*Primary Examiner*—Kevin M. Picardat
*Assistant Examiner*—D. M. Collins
(74) *Attorney, Agent, or Firm*—Knobbe, Martens, Olson & Bear, LLP

(57) ABSTRACT

The method of the present invention is related to the fabrication of a copper-based multilevel interconnect structure. This copper-based multilevel interconnect structure is based on the formation of vertical metal connections through copper-containing metal stud growth on an underlying horizontal metal pattern, followed by a stud encapsulation step against copper diffusion into the surrounding dielectric, i.e. the insulating layers. This method is of particular interest when the insulating layers used to obtain this interconnect structure are polymer layers with a low dielectric constant and preferably with a high degree of planarization.

10 Claims, 2 Drawing Sheets

METHOD FOR FORMING COPPER-CONTAINING METAL STUDS

FIELD OF THE INVENTION

The present invention is related to the formation of vertical conductive connections, particularly metal studs. Such connections can be implemented in metallization structures used for interconnecting integrated circuits.

BACKGROUND OF THE INVENTION

The ongoing focus on miniaturisation and the increasing complexity and speed requirements of integrated circuits demand for a continuous higher density integration. To achieve this, there is an ongoing downscaling in the dimensions of the active devices as well as of the structures interconnecting these devices. These interconnect structures can comprise multiple metal levels which are, dependent on the aimed interconnect pattern, either separated one from another by means of interlevel insulating layers or connected one to the other by means of a conductive connection through the insulating layer. Besides this downscaling of the dimensions, additional measures are required to be able to meet the stringent speed specifications, i.e. the signal delay. Conventionally the metal levels are Aluminum layers while the insulating layers are oxide layers. Therefore, in order to reduce the signal delay one can choose a metal layer with a higher conductivity compared to Aluminum and/or choose insulating layers with a lower dielectric constant compared to oxide layers. To meet these objectives Cu-containing metal layers and/or Cu-containing connections are or will be introduced in the near future.

The use of Cu in interconnect structures also has some commonly known disadvantages. At first, Cu can have a high diffusion in the surrounding insulating layers which negatively affects the reliability and the signal delay. Secondly, Cu easily oxidizes, especially at higher temperatures. Further, it is difficult to pattern Cu by means of reactive ion etching (RIE) because, amongst others, a high temperature is required and volatile Cu-compounds have to be found to etch copper.

Nowadays, there a two major ways of fabricating interconnect structures. In the conventional way as a start a conductive layer, i.e. a metal layer, is formed on an insulating layer (or on the substrate) and patterned thereafter usually by means of RIE. When a damascene technology is used, first an insulating layer is deposited and patterned and thereafter the conductive layer is deposited to fill the openings, eventually followed by a planarization step to remove the metal excess. Both ways still require adequate barrier layers to prevent the diffusion of Cu in the insulating layer. The damascene technology has the advantage that the difficult Cu RIE step is avoided. Damascene processing reduces the problem to dry etching of an insulating layer or a stack of insulating layers. The final planarization step yields inlaid horizontal copper interconnect lines in a planar topology. The added bonus of damascene processing is a substantial decrease in the cost factor compared to classical aluminum RIE processing. An expected cost reduction of about 30% has been calculated. The use of plating methods such as electroless and electrolytic copper plating is anticipated to further decrease the cost.

As stated before, due to the difficulty of RIE etching of copper layers, the major processing route for fabricating interconnect structures will be damascene processing, particularly dual damascene processing. This technique allows to build up horizontal metal patterns as well as vertical metal connections in the surrounding insulating layers. These vertical metal connections are required in order to be able to provide a conductive connection between two horizontal metal patterns being processed in different metal levels. To provide such a connection, usually first openings have to be formed in the insulating layer or in the stack of insulating layers between two different metal levels and filled thereafter with a conductive material. Examples of such openings are via holes or contact holes or trenches. To meet the high density integration requirements, the diameter of these openings is continuously decreasing, while at the same time the aspect ratio of these openings is increasing. Due to the small diameter and the high aspect ratios, the creation of these opening, especially the lithographic steps and the dry etchings steps involved, as well as the conformal filling of these openings with a metal or the combination of a metal and a barrier layer poses severe problems.

In patent application U.S. Pat. No. 4873565, incorporated herein by reference, an interconnection between metallization layers of a semiconductor device separated by an insulator is disclosed. A lead is covered with a diffusion barrier layer and a stud is formed above the diffusion barrier layer. Afterwards, the stud is covered with a corrosion preventing material on the sidewalls and on the top surface of the stud. The insulating material is then applied over the conductor and a second metallization level covers the insulating layer. Using this kind of interconnects, problems related to reliability and waste space of the surface area are eliminated. The above mentioned method does not take in account the problem of out-diffusion of copper in the surrounding insulating layer.

In patent application U.S. Pat. No. 4866008, incorporated herein by reference, the authors provide a method of forming a self-aligned conductive pillar on a lower level metallization interconnect to an upper level metallization. This invention focuses on the method by which the conductive pillars are formed by a self-aligned process over the first metallization interconnect with advantages in increased packaging density of structures on the device and a reduced current density in the conductive pillars.

AIM OF THE INVENTION

It is an aim of the invention to provide a solution to the problem of making vertical Cu-containing metal connections between two horizontal metal patterns being formed in two different metal levels and to provide a solution to the problem of diffusion of copper from the metal connection in the surrounding insulating layers. The method of the present invention avoids the inherent dry etching problem for the formation of openings in the interlevel insulating layer stack, especially for openings with a small diameter and a high aspect ratio, both for the conventional way of making interconnect structures as well as for a damascene technology. The method also circumvents the inherent dry etching problem for the formation of openings in the interlevel insulating layer stack, especially for openings with a small diameter and a high aspect ratio, both for the conventional way of making interconnect structures as well as for a damascene technology.

It is a further aim of the invention to fabricate Cu-containing metal studs.

SUMMARY OF THE INVENTION

The method of the present invention is related to a copper-based multilevel interconnect structure. This copper-based multilevel interconnect structure is based on the formation of vertical metal connections through copper stud growth on an underlying horizontal metal pattern, followed by an optional copper stud encapsulation step against copper diffusion into the surrounding dielectric, i.e. the insulating layers. Therefore, in an aspect of the invention a method for forming Cu-containing metal studs is disclosed comprising the steps of:

a) depositing a resist layer on a conductive pattern;
b) patterning said resist layer by a sequence of at least a lithographic and a removal step to thereby form an opening in said resist layer, said opening extending down to the surface of said conductive pattern;
c) depositing a Cu-containing metal to fill up said opening; and
d) removing said resist layer to thereby free the Cu-containing metal stud formed on said conductive layer.

The method of the invention can further comprise the steps of:

e) encapsulating said Cu-containing metal stud. This encapsulation can be performed in order to prevent out-diffusion of Cu in the surrounding insulating layers. Alternatively, particularly the resist layer, deposited in step a), can be a permanent polymer layer instead of a sacrificial resist layer. Preferably this permanent polymer layer has a low dielectric constant. In this case, the removal step, i.e. step d) is omitted.

In another embodiment of the invention, after coverage of the copper studs preferably with a planarizing polymer with a low dielectric constant, trench etching is performed in a single damascene process step which opens up the underlying copper via studs. Therefore, a method of forming an interconnect structure is disclosed, wherein after a Cu-containing metal stud is formed, said method further comprises the steps of:

f) depositing an insulating layer, said insulating layer covering said stud;
g) forming a patterned hard mask layer on said insulating layer; and
h) etching said insulating layer using said patterned hard mask layer as a mask to form an opening at least down to the surface of said Cu-containing metal stud.

In another embodiment of the invention, a method to obtain a dual damascene interconnect structure is disclosed without the inherent problem of dry etching of openings, i.e. contact openings, via openings and trenches. This method is for instance of interest when the insulating layers used to obtain this interconnect structure are polymer layers with a low dielectric constant and preferably with a high degree of planarization. A method for forming an interconnect structure is disclosed comprising the steps of:

a) depositing a resist layer on a conductive pattern;
b) patterning said resist layer by a sequence of at least a lithographic and a removal step to thereby form an opening in said resist layer, said opening extending down to the surface of said conductive pattern;
c) depositing a Cu-containing metal to fill up said opening;
d) removing said resist layer to thereby free the Cu-containing metal stud formed on said conductive layer;
e) encapsulating said Cu-containing metal stud;
f) depositing an insulating layer, said insulating layer covering said stud;
g) forming a patterned hard mask layer on said insulating layer; and
h) etching said insulating layer using said patterned hard mask layer as a mask to form an opening at least down to the surface of said encapsulated Cu-containing metal stud.

DETAILED DESCRIPTION OF THE INVENTION

Figure 1A:
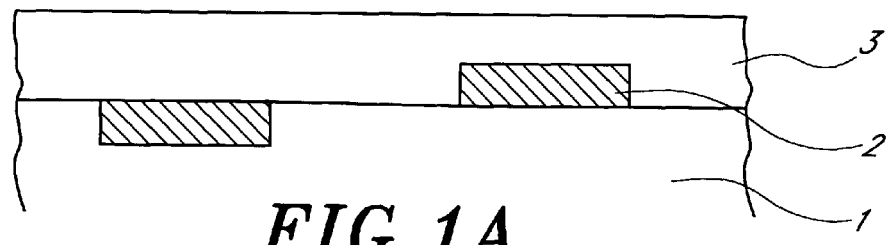
FIG. 1 depicts, according to an embodiment of the invention, a schematic process flow used to create a dual-damascene structure (right-hand side of the drawings) as well as a classical metal structure (left-hand side of the drawings) both based on the formation of Cu-containing metal studs.

In relation to the appended drawings the present invention is described in detail in the sequel. It is apparent however that a person skilled in the art can imagine several other equivalent embodiments or other ways of executing the present invention, the spirit and scope of the present invention being limited only by the terms of the appended claims.

The method of the present invention allows the fabrication of a copper-based multilevel interconnect structure. This copper-based multilevel interconnect structure is based on the formation of vertical metal connections through copper stud growth on an underlying horizontal metal pattern, followed by a copper stud encapsulation step against copper diffusion into the surrounding dielectric, i.e. in the insulating layers. This encapsulation step is preferably a self-aligned step. In order to form the Cu studs, first a resist layer is deposited on the underlying horizontal pattern. Preferably this resist layer is a sacrificial polymer layer with a thickness typically in the range from 0.2 $\mu$m to 3 $\mu$m. However, also a permanent polymer layer can be used preferably with a low dielectric constant and a high degree of planarization. The horizontal metal pattern can comprise at least one element selected from the group comprising Cu, a Cu-alloy, Al, an Al-alloy, Ti, Co, Ni, Pt, Ta, TiN, TaN or a compound of one of the previous elements. Particularly, this horizontal metal pattern can be a stack of multiple layers wherein each of the layers is formed with elements of the aforementioned group in order to form the combination of e.g. a metal layer and a (diffusion) barrier layer, like e.g. Al and TiN, or a metal layer and a contact layer like e.g. Al and TiSi$_2$, or a metal layer and a conductive (diffusion) barrier layer, like e.g. Cu and Ta, or Cu and Co. The horizontal metal pattern can be an inlaid structure, i.e. being formed in an insulating layer by means of a damascene technology, or a conventional metal pattern being formed on an insulating layer.

After the deposition of the resist layer, this layer can be patterned by a sequence of at least a lithographic and a removal step to thereby form an opening in said resist layer, said opening extending down to the surface of said horizontal metal pattern. A Cu-containing metal is deposited to fill up this opening. In case the polymer layer is a sacrificial one, then this layer is removed e.g. by a wet etch process. Finally the Cu can be encapsulated in order to avoid the out-diffusion of the Cu.

According to an embodiment of the invention, the next process steps involve embedding of the copper studs in an insulating layer or in a stack of insulating layers for trench formation. Particularly, the insulating layers which are deposited on the Cu studs, being encapsulated or not, can be self-planarizing organic polymeric spin-on films with a low dielectric constant, i.e. with a dielectric constant smaller than the dielectric constant of silicon dioxide. The trench structures are obtained in a single-step damascene process by classical photo-lithographic patterning of the polymer and trench etch by RIE down to the surface of the underlying encapsulated copper studs using a patterned hard mask layer as a mask. Examples of such hard mask layers are silicon layers selected from the group of oxides, nitrides and oxynitrides. Also a fluorinated silicon oxide can be used. Next, an inlaid metal pattern can be formed by deposition of at least one element selected from the group comprising Cu, a Cu-alloy, Al, an Al-alloy, Ti, Co, Ni, Pt, Ta, TiN, TaN. Particularly, this metal pattern can be a stack of multiple layers wherein each of the layers is deposited with elements selected from the aforementioned group in order to form a stack of e.g. a conductive (diffusion) barrier layer and a metal layer, like e.g. Ta and Cu, or Co and Cu. This inlaid metal pattern contacts the top surface of the Cu stud. If the Cu-stud is encapsulated in a non-conductive barrier layer, then before the deposition an opening has to be formed in said barrier layer in order to contact the Cu. Finally, metal and barrier chemical mechanical polishing (CMP) assures that the inlaid metal pattern flushes with the top surface of the dielectric.

Figure 1B:
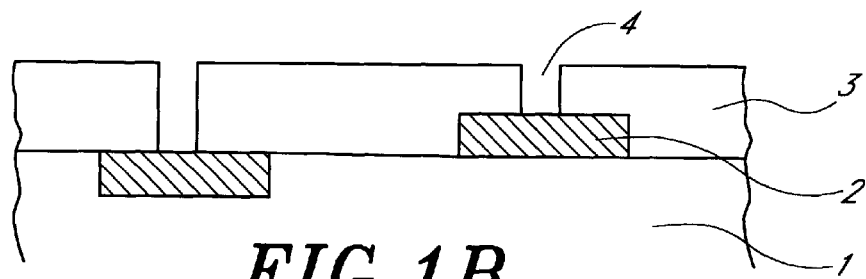
Figure 1C:
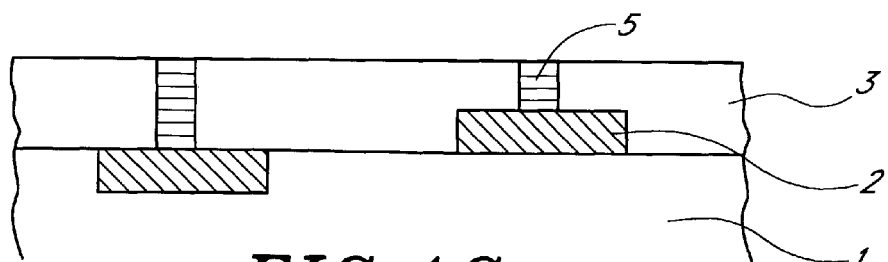
Figure 1D:
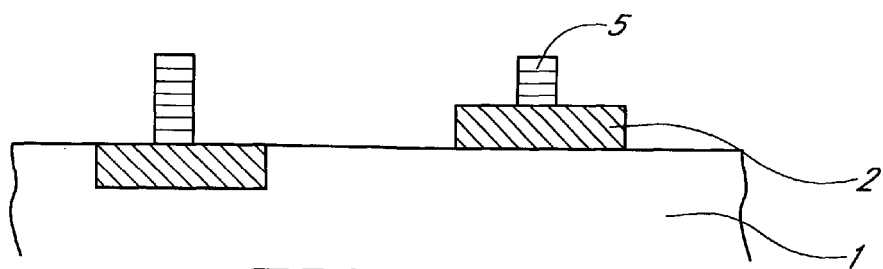
Figure 1E:
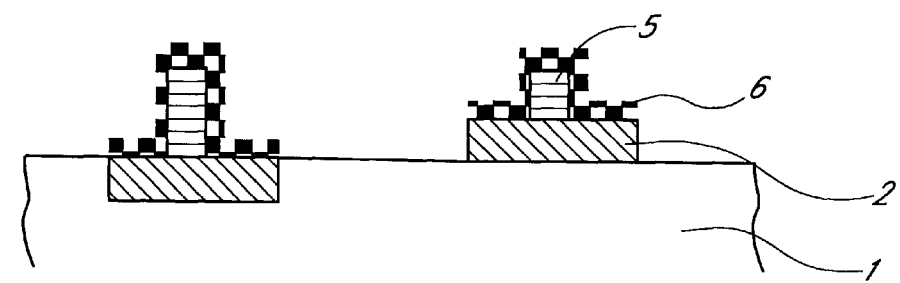
Figure 1F:
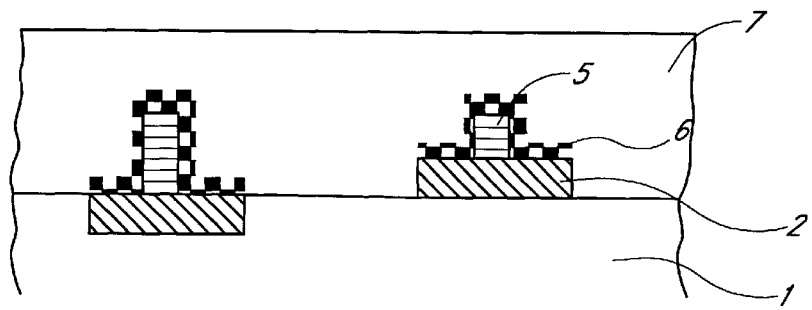
Figure 1G:
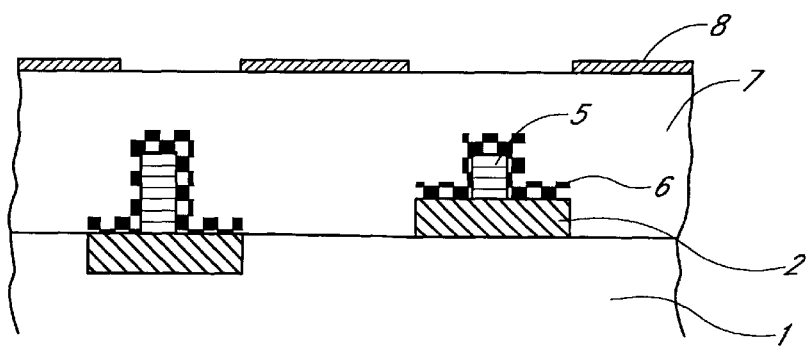
Figure 1H:
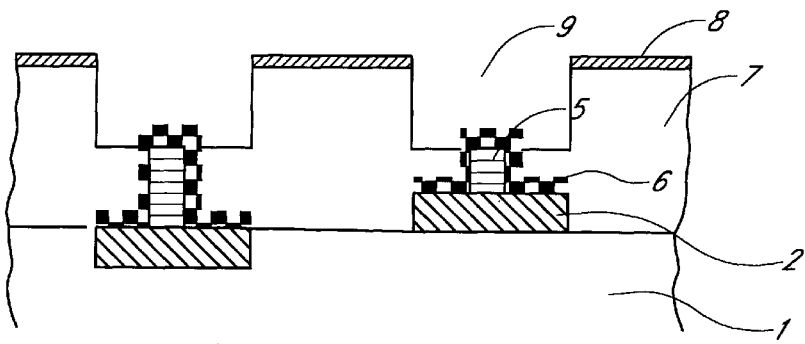
Figure 1I:
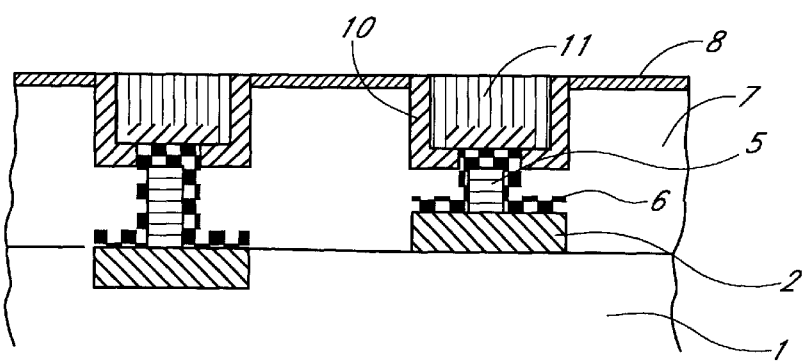

In a preferred embodiment of the invention, an example (FIG. 1) is disclosed to form a dual damascene interconnect structure. The method comprises the steps of:

a) depositing (FIG. 1a)) a resist layer (3) on a conductive pattern (2). According to this example, the resist layer is a photo-definable sacrificial polymer. Although for the stud formation a sacrificial polymer is preferable, a permanent polymer can also be used. The thickness of the photo-polymer typically ranges between about 0.2 µm and 3 µm. The sacrificial or permanent polymer can be applied by sputtering, spincoating, vapour deposition or epitaxy. The conductive pattern is a horizontal metal pattern comprising at least one element selected from the group comprising Cu, a Cualloy, Al, an Al-alloy, Ti, Co, Ni, Pt, Ta, TiN, TaN or a silcide of one of the previous elements. Particularly, this horizontal metal pattern can be a stack of multiple layers wherein each of the layers is formed with elements of the aforementioned group. The horizontal metal pattern can be an inlaid structure, i.e. being formed in an insulating layer (1) by means of a damascene technology, or a conventional metal pattern being formed on an insulating layer. Both possible structures are shown combined in the drawings. According to the present invention, it does not matter which of the two metal pattern technologies is used. They will be discussed together in the same drawings. According to this example, a horizontal aluminum pattern is formed in an insulating layer using a damascene technology. Preferably the insulating layer is a layer with a low dielectric constant, i.e. a dielectric constant below 3.9. Particularly the insulating layer can be an organic polymer layer selected from a group comprising the benzocyclobutarenes, i.e. benzocyclobutene (BCB) commercially available as Cyclotene 5021™, poly arylene ether, i.e. FLARE™ II, aromatic hydrocarbon, i.e. SILK™, and polyimides. According to this example, the insulating layer is a BCB layer. Amongst others, BCB is selected due to its high degree of planarization and excellent coverage of an underlying metal pattern.

According to this embodiment of the invention, the method for forming a dual damascene interconnect structure further comprises the step of:

b) patterning said resist layer (FIG. 1b) by a sequence of at least a lithographic and a removal step to thereby form an opening (4) in said resist layer, said opening extending down to the surface of said conductive pattern. According to this example, the resist layer is a photo definable sacrificial polymer, which is exposed and developed to create an opening extending down to the surface of the underlying horizontal pattern.

According to this embodiment of the invention, the method for forming a dual damascene interconnect structure further comprises the step of:

c) depositing a Cu-containing metal (FIG. 1c)) to fill up said opening in said resist layer. According to the example, the process proceeds with the formation of metal studs (5) in a sacrificial photo-definable polymer layer by a deposition. Particularly, a selective deposition technology such as e.g. electroless plating can be used. Selective depositing means depositing a material on a predetermined place, for instance in an opening. The metal of choice for future technologies is copper. The preferred embodiment of the invention is based on the creation of openings in a photo-resist layer of adequate thickness, and selective electroless copper deposition into these openings onto an underlying horizontal metal pattern. The height of the copper studs is controlled by the plating time. The electroless deposition method is inherently selective, works at low temperatures, and can be performed on many conductive materials such as e.g. TiN, being the ARC layer of a classical aluminum-based metal stack, TaN, being a diffusion barrier for copper, and also directly on an underlying copper layer.

According to this embodiment of the invention, the method for forming a dual damascene interconnect structure further comprises the step of:

d) removing said resist layer (FIG. 1d)) to thereby free the Cu metal stud formed on said conductive layer. After the Cu deposition, the resist layer is removed using a wet etching or a gas chemistry which does not oxidize the copper material. This results in free-standing Cu plugs on top of the underlying horizontal metal pattern.

According to this preferred embodiment of the invention, the method for forming a dual damascene interconnect structure further comprises the step of:

e) encapsulating said Cu metal stud. According to the example, after the creation of free-standing copper studs, copper encapsulation (FIG. 1e)) can be performed in order to avoid copper diffusion into insulating layer(s) to be deposited in the next process step(s). Particularly, the barrier layer consists of a material selected from a group consisting of Co, Ta, Ti, TiN, TaN, $Si_3N_4$, $W_xN$ and/or compounds thereof. In $W_xN$, x can vary between 1 and 4 and between 2 and 3. This encapsulation of the copper studs can be done with either a conductive barrier material or with a very thin high quality non-conductive copper diffusion barrier such as $Si_3N_4$, particularly this $Si_3N_4$ layer can be deposited by high density Plasma chemical vapour deposition (CVD). The latter route has the advantage of complete protection of the underlying devices from vertical copper out-diffusion. However, the formation of openings down to the surface of the Cu stud in a later stage will be more difficult due to the additional etching of the $Si_3N_4$ layer on top of the studs. This additional etching is required to ensure an electrical contact. As a consequence, the preferred embodiment is the application of a thin conductive barrier layer (6) which encapsulates the copper studs. The conductive copper barrier layer can be deposited using electroless plating, or a sputtering technique, or by selective or non-selective (blanket) chemical vapour deposition. Selective encapsulation has the advantage of being self-aligned and requires only one process step. Particularly, electroless plating, being a selective deposition technique is the preferred technique due to its low cost and the simplicity of processing. Literature relating to selective plating of copper barrier layers such as Co(W, P) is already available, as e.g in Y. Shacham-Diamand and S. Y. Lopatin, "High aspect ratio quarter-micron electroless copper integrated technology", Materials for Advanced Metallization (1997), pp.11–14.

In an alternative embodiment of the invention instead of a selective deposition technique also a blanket deposition technique can be used. Blanket deposition of the conductive barrier layer by either physical vapour deposition (PVD) or CVD techniques requires substantially more process steps due to the requirement of the barrier layer patterning. A non-critical lithographic resist pattern identical to the underlying horizontal metal pattern is formed on the barrier layer. Then, the barrier layer is patterned by means of a reactive ion etch (RIE) step using the patterned resist layer as a mask. After the RIE step the resist is removed using a wet and/or a dry etching step.

According to the preferred embodiment of the invention, the method for forming a dual damascene interconnect structure further comprises the steps of:

f) depositing (FIG. 1f)) an insulating layer (7), said insulating layer covering said stud;

g) forming (FIG. 1g)) a patterned hard mask layer (8) on said insulating layer. Preferably the insulating layer is a layer with a low dielectric constant. Particularly the insulating layer can be an organic polymer layer selected from a group comprising the benzocyclobutarenes, i.e. benzocyclobutene (BCB) commercially available as Cyclotene 5021™, poly arylene ether, i.e. FLARE™ II, aromatic hydrocarbon, i.e. SILK™, and polyimides. More particularly, the insulating layer is a layer with a high degree of planarization. According to the example, after the formation of the Cu stud and the optional copper diffusion barrier deposition, an organic polymer with a low dielectric constant and high intrinsic degree of planarization is deposited. Particularly, a BCB layer is deposited. The thickness depends on the design rules of the specific technology wherein these interconnect structures are processed. The deposition is preferably by means of a spin-coating technique because of the high degree of self-planarization on high density structures of such a technique. Particularly, this is experimentally observed for some of the aforementioned polymeric layers as e.g. BCB. A planar insulating layer simplifies the subsequent trench definition lithography step. Next, a non-conductive hard mask layer is deposited, e.g. using a chemical vapour deposition or a spin-on technique. For the purpose of this disclosure, a hard mask layer is defined as a layer which can be etched selectively to an other layer and which therefore can be used as an etch mask to etch said other layer. Traditional lithographic resists are not suited to be used as hard mask layers for patterning organic spin-on materials because these resists are also based on organic polymers resulting in an insufficient etch selectivity, particularly in an oxygen-based chemistry, with regard to the organic spin-on material. Therefore inorganic hard mask layers like oxides or nitrides or oxynitrides are used. The non-conductive hard mask layer is patterned using a fluorine-based RIE chemistry.

According to the preferred embodiment of the invention, the method for forming a dual damascene interconnect structure further comprises the steps of:

h) etching (FIG. 1h))said insulating layer using said patterned hard mask layer as a mask to form an opening (9) at least down to the surface of said encapsulated Cu metal stud. According to the example, the organic polymer is etched using an oxygen-based RIE chemistry to form an opening, i.e. a trench. The etching of the polymer is timed and has to be sufficiently long to expose the surface of the encapsulated copper stud in order to allow a contact without a high resistance. In another embodiment of the invention, if the encapsulation of the Cu stud is performed with a non-conductive barrier layer, then also an opening has to be created through the barrier layer in order to allow a low-ohmic contact to the Cu stud.

According to an embodiment of the invention, the method for forming a dual damascene interconnect structure further comprises the step of:

i) forming an inlaid metal pattern by deposition of at least one element selected from the group comprising Cu, a Cu-alloy, Al, an Al-alloy, Ti, Co, Ni, Pt, Ta, TiN, TaN. Particularly, this metal pattern can be a stack of multiple layers wherein each of the layers is deposited with elements selected from the aforementioned group in order to form a stack of e.g. a conductive (diffusion) barrier layer an a metal layer, like e.g. Ta and Cu, or Co and Cu. This inlaid metal pattern contacts the top surface of the Cu stud. If the Cu-stud is encapsulated in a non-conductive barrier layer, then before the deposition an opening has to be formed in said barrier layer in order to contact the Cu. According to the example (FIG. 1i)) a Ti-based conductive barrier layer (10) is deposited using PVD, followed by a subsequent deposition of a Cu-containing metal (11). This deposition can be performed using CVD, or PVD, or electroplating, or electroless plating. A final chemical mechanical polishing (CMP) step will remove the excess metal and barrier layer. The presence of the remainder of hard mask layer is beneficial for the CMP step because it serves as a CMP removal stop thereby avoiding the stopping of the CMP step directly on the underlying polymer. If necessary the remaining hard mask layer can be removed by either a wet etch in dilute HF (no attack of Cu lines) or by a dry etch (after selective capping of the copper lines).

Finally, an optional barrier layer of e.g. Ti, TiN, Ta, TaN can be deposited using sputtering (PVD) or CVD and patterned in order to enclose the metal line. In this case, further patterning of the capping layer is needed which complicates the process flow. On the other hand, electroless deposition of a barrier metal can be used to selectively cap the copper lines, which simplifies the process flow. In the final structure the Cu is then completely encapsulated by a barrier layer in a BCB film.

An advantage of the preferred embodiment is the absence of an intermittent hard mask layer between the BCB layer which defines the via level and the one that defines the trench level. Usually, most classical dual damascene process flows require the presence of such hard mask interlayer for etch control The hard mask interlayer has a high dielectric constant, i.e. equal or higher than about 4. Therefore, such a hard mask layer has a negative effect on the inter-metal level capacitance. In the absence of a hard mask layer, the classical dual damascene processing has to rely on timed etch steps, which could prove to be very difficult to implement in a production environment. Another advantage of the present invention is that barrier layer deposition and copper filling of the underlying via structures is simplified because filling of high aspect ratio trenches and via combinations in a single process step is avoided.

What is claimed is:

1. A method for forming Cu-containing metal studs comprising the steps of:

a) depositing a resist layer on a conductive pattern;

b) patterning said resist layer by a sequence of at least one lithographic and at least one removal step to thereby form an opening in said resist layer, said opening extending down to the surface of said conductive pattern;

c) depositing at least one Cu-containing metal to fill up said opening; and d) removing said resist layer to thereby free the Cu-containing metal stud formed on said conductive layer e) encapsulating said Cu-containing metal stud by depositing a barrier layer.

2. A method as recited in claim 1 wherein said barrier layer consists of a material selected from a group consisting of Co, Ta, Ti, TiN, TaN, $Si_3N_4$, $W_xN$ and/or compounds thereof.

3. A method as in claim 1, wherein both the Cu-containing metal and the barrier layer are selectively deposited.

4. A method as in claim 3 wherein both the Cu-containing metal and the barrier layer are selectively deposited by means of electroless plating.

5. A method for forming an interconnect structure comprising the steps of:

a) depositing a resist layer on a conductive pattern;

b) patterning said resist layer by a sequence of at least one lithographic and at least one removal step to thereby form an opening in said resist layer, said opening extending down to the surface of said conductive pattern;

c) depositing a Cu-containing metal to fill up said opening;

d) removing said resist layer to thereby free the Cu-containing metal stud formed on said conductive layer;

e) encapsulating said Cu-containing metal stud;

f) depositing an insulating layer, said insulating layer covering said stud;

g) forming a patterned hard mask layer on said insulating layer; and h) etching said insulating layer using said patterned hard mask layer as a mask to form an opening at least down to the surface of said encapsulated Cu-containing metal stud.

6. A method as in claim 5, wherein said Cu-containing metal stud is encapsulated by depositing a barrier layer of a material selected from a group comprising Co, Ta, Ti, TiN, TaN, $Si^3N_4$, $W_xN$ and/or compounds thereof.

7. A method as in claim 5 wherein the insulating layer is a layer with a dielectric constant below 3.9.

8. A method as in claim 5, wherein the insulating layer is an organic polymer layer.

9. A method as in claim 8 wherein the organic polymer layer is selected from a group comprising the benzocyclobutarenes, poly arylene ether, aromatic hydrocarbon and polyimides.

10. A method as in claim 5 wherein the hard mask layer is selected from a group comprising silicon oxide, silicon nitrides and silicon oxynitrides.

* * * * *